INVENTOR.
JULIAN R. A. BEALE
ANDREW F. BEER
BY KENNETH W. MOULDING

Frank R. Trifari
AGENT

INVENTOR.
JULIAN R. A. BEALE
ANDREW F. BEER
BY KENNETH W. MOULDING
Frank R. Trifari
AGENT INVENTOR.
JULIAN R. A. BEALE
ANDREW F. BEER
BY KENNETH W. MOULDING
Frank R. Trifari
AGENT United States Patent Office 3,377,526

Patented Apr. 9, 1968

3,377,526

VARIABLE GAIN TRANSISTOR STRUCTURE EMPLOYING BASE ZONES OF VARIOUS THICKNESSES AND RESISTIVITIES

Julian Robert Anthony Beale, Reigate, Andrew Francis Beer, Crawley, and Kenneth William Moulding, Horley, England, assignors to North American Philips Company, Inc., New York, N.Y., a corporation of Delaware Filed Dec. 15, 1964, Ser. No. 418,414
8 Claims. (Cl. 317—235)

The invention relates to a transistor comprising a semiconductor body with an emitter zone, a base zone and a collector zone and to a circuit arrangement comprising such a transistor.

Such transistors are employed inter alia as amplifying elements in arrangements having automatic volume control. In such arrangements high input signals are amplified to a lesser extent than low input signals, which is achieved, for example, by applying the input signals to the base zone of the transistor and by rendering the bias voltage of the base zone dependent upon the value of the input signals to be amplified. However, this involves the disadvantage that usually with high input signals a fairly strong distortion occurs, which can be avoided only with great difficulty.

The invention has for its object inter alia to provide a transistor structure in which said distortion does not appear or occurs at least to a lesser extent.

According to the invention a transistor comprising a semi-conductor body with an emitter zone, a base zone and a collector zone is characterized in that the portion of the base zone located beneath the emitter zone comprises a thicker part and a thinner part, said two parts having a substantially homogeneous thickness, while the base zone is provided with two base contacts and the emitter current appearing in operation in the base zone and flowing between the emitter zone and the collector zone may be conducted mainly through the thicker part or through the thinner part of the base by applying a bias voltage between the base contacts.

The transistor according to the invention may be operative between two and in two extreme states; one of these extreme states provides a high amplification, while the major part of the emitter current passes through the thinner part of the base zone. The other extreme state provides a low cut-off frequency, while the major part of the emitter current passes through the thicker part of the base zone.

The thicker part and the thinner part of the base zone may be obtained substantially independently of each other during the manufacture of the transistor, which will be described more fully hereinafter. This means that the properties of the transistor according to the invention in its two extreme states may be adjusted at will during the manufacture, which is very important. It is thus possible to manufacture in a simple manner various types of transistors according to the invention, the said properties matching different possibilities of use. Important is in this case that the resistivity of the thinner part and of the thicker part of the base zone may be different and an important embodiment of a transistor according to the invention is characterized in that the thicker part and the thinner part of the base zone have different resistivities.

If the thinner part of the base zone has a higher resistivity than the thicker part, a small adjusting current is sufficient to change over the transistor from one extreme state, in which the emitter current passes largely through the thinner part of the base zone, to the state in which the emitter current passes largely through the thicker part, so that the transistor is suitable for use in a very sensitive automatic gain control circuit. Thus a further embodiment of a transistor according to the invention is characterized in that the thinner part has a higher resistivity than the thicker part.

If the thicker part of the base zone has a higher resistivity than the thinner part, the range in which automatic gain control can be obtained by means of the transistor is larger than in the reverse case referred to above. The sensitivity, however, is lower, which means that a higher adjusting current is required for changing over the transistor from one extreme state to the other. However, in many cases, in which a large range of automatic gain control is desired, this is not important and a preferred embodiment of a transistor according to the invention is characterized in that the thicker part has a higher resistivity than the thinner part.

It should be noted that the thinner part and the thicker part of the base zone may be diffused zones which do not have a homogeneous resistivity. The resistivity of a zone is to denote here the average resistivity defined as the imaginary resistivity which the zone should have in order to have the same conduction power as the zone has in fact, if the zone had a homogeneous resistivity.

It will be obvious that the efficiency of the transistor is the greater, the greater is the difference in operation of the transistor in the two extreme states. It is therefore to be preferred for the transistor to have a configuration in which at least 90% of the emitter current passes through the thinner part of the base zone. It is furthermore advisable for the transistor to have a configuration in which less than 40%, preferably less than 10% of the emitter current passes through the thinner part of the base zone.

A reasonable difference between the cut-off frequencies in the said extreme states may be obtained when the thickness of the thicker part is at least twice that of the thinner part of the base zone. The thickness of the thicker part is preferably at least five times that of the thinner part.

In order to facilitate the application of the required contacts on the emitter zone and the base zone, the extent of the base zone is preferably three times that of the emitter zone.

In an advantageous embodiment the extent of the emitter zone is small as compared with that of the base zone, while the collector zone has a more highly doped part and a less highly doped part, and only part of the volume of the collector zone directly adjacent the base zone constitutes the more highly doped part and viewed from the emitter zone in the direction of thickness of the base zone, said more highly doped part is least partly beneath the emitter zone.

The term "directly adjacent" is to be understood here in a practical sense. The more highly doped part is therefore considered to be directly adjacent the base zone, if the depletion layer formed at the base-collector junction upon the application of a reverse bias voltage of a value between 5 and 10 v. reaches the more highly doped part. It should be noted that sharp junctions are not obtained, when for example diffusion methods are employed for the formation of zones in a semiconductor body.

The more highly doped part may, viewed from the emitter zone in the direction of thickness of the base zone, be advantageously disposed below the whole of the emitter zone in order to improve the current conduction in the collector zone, particularly when the transistor is driven in the state in which high amplification is obtained.

The more highly doped part of the collector zone may extend beyond the base zone in one or more lateral directions, so that the collector series resistance may be reduced by the lateral current spread thus obtained in the collector zone. A more highly doped part, which is located beyond the lateral boundaries of the base zone, does not appreciably contribute to the collector capacity.

A more highly doped part may, viewed from the emitter zone in the direction of thickness of the base zone, be located beneath the whole of the thinner part of the base zone, so that the current conduction in the collector zone is favoured, when the transistor is driven in the state of high amplification. The state of high amplification is favoured when the more highly doped part, viewed from the emitter zone in the direction of thickness of the base zone, does not extend substantially beneath the thicker part of the base zone. Thus, in addition, the collector capacitance is limited.

An important embodiment of a transistor according to the invention, which can be manufactured in a comparatively simple manner with satisfactorily reproducible properties, is characterized in that the emitter zone has the form of a strip extending transversely over the base zone and having a dimension in the longitudinal direction at least two thirds of the dimension of the base zone in the same direction, while the demarcation between the thicker and the thinner parts of the base zone is substantially parallel to the longitudinal direction of the strip. In this structure the more highly doped part of the collector zone extends preferably beyond the base zone in a direction substantially corresponding to the longitudinal direction of the strip.

In a further embodiment the emitter zone has the form of a flat, closed configuration, one base contact being disposed inside said closed configuration and the other base contact being disposed outside said configuration. The emitter zone and the two base contacts may be substantially circular and be concentrical to each other. In this case the outermost base contact may surround the emitter zone substantially completely, an opening being provided at a place which corresponds to a lateral prolongation of the more highly doped part of the collector zone.

The emitter zone is preferably disposed in a substantially flat surface of the semiconductor body, while the collector contact is disposed on said surface in the form of a metal layer which extends over at least part of the surface portion corresponding to the portion of the more highly doped part of the collector zone extending beyond the base zone. In this manner the collector series resistance can be produced.

The transistor is preferably a planar transistor. Such a transistor is manufactured by diffusion treatments, in which an oxide layer serves as a mask and the semiconductor body of the ready transistor usually has a protective oxide layer.

The invention relates also to a circuit arrangement comprising a transistor according to the invention and bias-voltage means for applying a bias voltage between the base contacts, the bias voltage lying between two limit values so that the major part of the emitter current passes through the thicker part, at one of the two limit values of the bias voltage, and through the thinner part at the other of the two limit values of the bias voltage. The bias-voltage means may supply a bias voltage which is continuously variable between the two limit values.

A few embodiments of a transistor according to the invention and methods of manufacturing the same and an embodiment of a circuit arrangement comprising a transistor according to the invention will now be described more fully with reference to the diagrammatic drawing.

Figure 1:
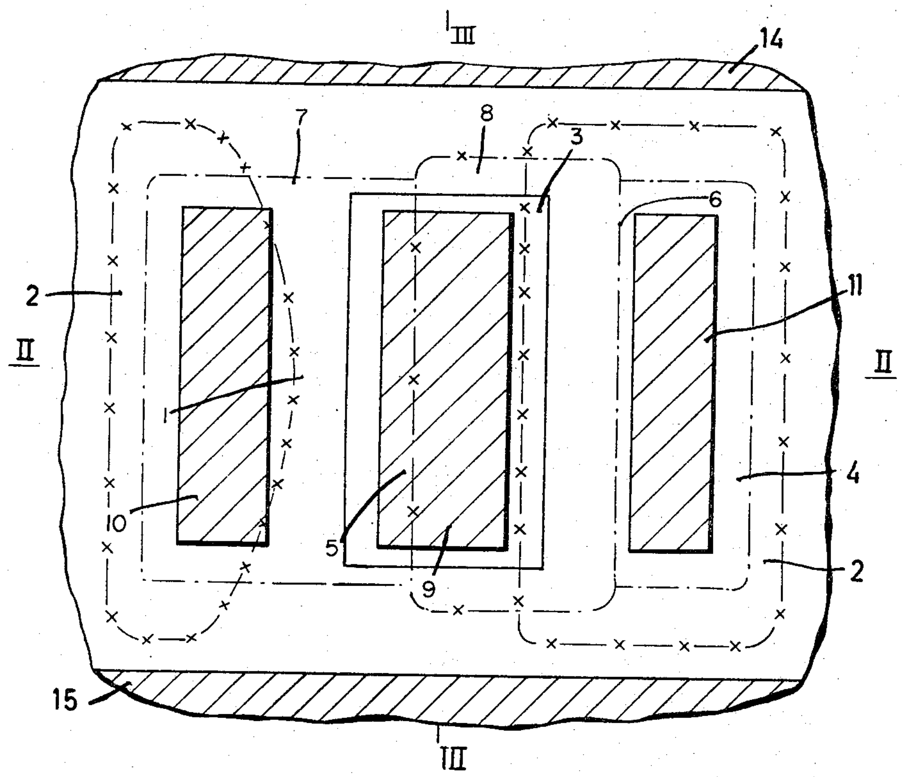
FIG. 1 is a plan view of a first embodiment of a transistor according to the invention.
Figure 2:
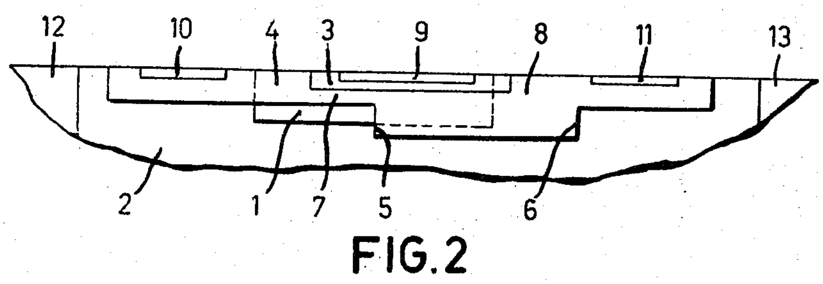
FIGS. 2 and 3 are cross sectional views taken on the lines II—II and III—III respectively in FIG. 1.
Figure 3:
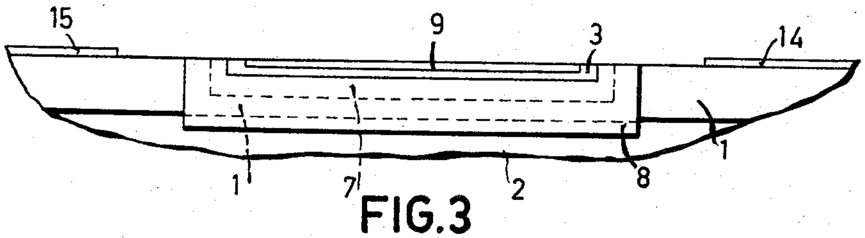

The FIGS. 1, 2 and 3 refer to a first embodiment of a transistor according to the invention, in which the transistor comprises a silicon die having a more highly doped n-type part 1 and a less highly doped n-type part 2 (shown only partly), which parts together form a collector zone. The thickness of the die is 200$\mu$ and the part 2 has a resistivity of 5 ohm-cm.

The transistor comprises furthermore an n-type emitter zone 3 and a p-type base zone 4. The thickness of the base zone 4 in the die is not the same everywhere. The base zone has thickness variations at 5 and 6 in steps, so that viewed from the emitter zone 3 in the direction of thickness of the base zone 4, the base zone 4 has a thinner part 7 and a thicker part 8 beneath the emitter zone 3. The ratio between the thicknesses of the thicker part 8 and the thinner part 7 is 10:1, Part of the volume of the collector zone directly adjacent the base zone 4 is more highly doped and, viewed from the emitter zone 3 in the direction of thickness of the base zone 4 said part 1 is located partly below the emitter zone and below the thinner part 7 of the base zone and does substantially not extend beneath the thicker part 8 of the base zone.

The emitter zone 3 has the form of a strip which extends substantially transversely across the base zone and the demarcation 5 between the thinner part 7 and the thicker part 8 of the base zone extends substantially parallel to the longitudinal direction of the strip. An emitter contact 9 and two base contacts 10 and 11 are provided. The base contacts 10 and 11 have the shape of strips which are substantially parallel to the strip-shaped emitter contact 9 and the emitter zone 3, which are located between the contacts 10 and 11.

FIG. 1 is a plan view in which the location of the zones and the other parts of the transistor are shown, without taking into account what is visually found on the surface of the semiconductor body. The contacts 9, 10 and 11 are shaded and surrounded by full lines. The emitter zone 3 is surrounded by a full line and the base zone 4 with the stepwise thickness variations at 5 and 6 is indicated by dot-and-dash lines. The portion lying on the left-hand part of FIG. 1 inside the dot-cross line and the portion lying in the right-hand part of FIG. 1 inside the dash-cross- and the dash-dot-cross lines illustrate the boundaries of the less highly doped part 2 of the collector zone in the vicinity of the base zone 4. The more highly doped part 1 extends from the emitter zone 3 beyond the base zone 4 in the longitudinal direction of the strip 3 and at a given distance from the base zone 4 around the latter, which is illustrated in FIG. 2 by the parts 12 and 13 of the collector zone.

It should be noted that the lateral boundaries of that part of the more highly doped part 1 which is located beneath and on the left-hand side (FIG. 1) of the emitter zone 3 are not only indicated by straight lines. This part of the part 1 exhibits a narrowed portion at the level of the centre (viewed in the longitudinal direction) of the strip-shaped emitter zone 3. This shape of the part 1 permits of reducing the collector series resistance with a small increase in the base-collector junction capacitance. Metal layers 14 and 15 are provided on the more highly doped part 1 of the collector zone in order to improve current conduction in the collector zone.

FIG. 3 is a cross sectional view taken on the line III—III in FIG. 1; this figure shows partly the boundaries of the thinner part 7 and of the less highly doped part 2 in broken lines. It should be noted that the left-hand and the right-hand boundaries of the thinner part 7 and of the thicker part 8 of FIG. 3 do not coincide, since this is not necessary. Viewed along the line III—III the thicker part 8 may be caused in a simple manner to overlap slightly the thinner part 7 on both sides.

Supply conductors (not shown) are secured to the contacts 9, 10 and 11. A supply conductor for the collector zone may be connected to the metal layer 14, 15 and/or, if desired, to the lower side of the semi-conductor die. Parts of the surface of the die may be provided with an oxide layer (not shown). A method of manufacturing the device shown in FIGS. 1, 2 and 3 will now be described.

The manufacture starts from an n-type silicon die doped with phosphorus and having a resistivity of 5 ohm-cm. and a thickness of 0.25 mm. The transverse dimensions are unessential, since simultaneusly a plurality of transistor structures may be provided in the silicon die, said structures being separated subsequently from each other by subdividing the die. As an alternative, the transistor to be manufactured may form part of a solid circuit, in which further circuit elements are provided in the die.

An oxide layer is grown on the die by heating the die in wet oxygen saturated by water vapour of 98° C. at 860° C. for four hours. In the oxide layer an opening is made in a conventional manner by means of a photohardening lacquer ("photo-resist") and an etchant. The opening corresponds to the thicker part 8 of the base zone 4. The thicker part 8 is obtained by diffusing boron in the die through the opening by heating the die at 1150° C. for two hours in an oven in which boron nitride is heated at 1000° C., the resultant boron nitride vapour being passed over the die by means of a nitrogen flow. The thickness of the resultant p-type zone is $4\mu$ and the surface concentration of boron is about $5\times10^{18}$ atoms/ccm.

The opening in the oxide layer is closed by heating at 860° C. in wet oxygen for 4 hours and a new opening is provided in the oxide layer for applying the more highly doped part 1 of the collector zone. The surface part protected from the diffusion is located inside the ranges surrounded by the chain-cross lines of FIG. 1.

Phosphorus is diffused into the deposed surface of the die and the depth of penetration is indicated in the cross sectional view of FIG. 2 partly by a broken line. The diffusion is carried out by heating the die at 1150° C. for 80 minutes in an oven in which phosphorus nitride is heated at 900° C., the resultant vapour is led over the die by means of a flow of nitrogen. The penetration depth of the resultant n-type zone is $3\mu$ and the surface concentration of the phosphorus is about $2\times10^{18}$ atoms/ccm. Only part of the diffusion is operative for the formation of the part 1, since part of the phosphorus diffusion is overdoped by the preceding diffusion of boron between the parts 5 and 6.

The oxide layer is grown again in the aforesaid manner and an opening is made therein in order to obtain the thinner part 7 of the base zone 4. Boron is diffused into the die through said opening by heating the die at 1100° C. for 20 minutes in an oven in which boron nitride is heated at 1000° C. and the resultant vapour is passed over the die by means of a flow of nitrogen. The penetration depth of the resultant p-type zone is $1\mu$ and the surface concentration of boron is about $1\times10^{19}$ atoms/ccm.

The oxide layer is again closed by the method described above and a new opening is made in the oxide layer in order to obtain the emitter zone 3. Phosphorus is to this end diffused in the die through said opening by heating the die at 1100° C. for 10 minutes in an oven in which phosphorus nitride is heated at 1000° C. and the resultant vapour is passed over the die by means of a stream of nitrogen. The penetration depth of the resultant n-type zone is $0.5\mu$ and the surface concentration of phosphorus is about $5\times10^{20}$ atoms/ccm.

The oxide layer is closed again, after which openings are made therein for applying the contacts 9, 10 and 11 and the metal layer 14, 15. Aluminum is applied to the whole surface, i.e. both in the openings and on the remaining oxide layer to a thickness of 3000 A. by vapour deposition in vacuo. In a conventional manner, with the aid of a photo-resist and an etchant, the aluminum layer is removed with the exception of the parts in the openings. The aluminum is then alloyed with the die by heating the latter at a temperature of 550° C. to 600° C. for 20 minutes in an atmosphere of highly pure hydrogen.

Electrical connections may be obtained by connecting a gold wire with the contacts 9, 10 and 11 and the layer 14, 15. This may be obtained for example by thermal bonding, in which case a gold wire is pressed against the contacts 9, 10 and 11 and the layer 14, 15 for 20 seconds at a temperature of 350° C. The bottom side of the die is ground off until the final thickness of the die is $200\mu$. The ground surface of the die is secured to a gold-plated NiFe lead by heating at 450° C. The leader may also serve as a collector contact, as the case may be, in cooperation with the metal layer 14, 15.

After each of the aforesaid diffusion and alloying treatments the surface of the die and of the oxide layer thereon is cleaned by boiling in concentrated nitric acid for 15 minutes and by subsequent washing in distilled, dionized water. It will be obvious that when using the construction in which the die is secured to a supporting plate, the surface of the die is protected by an oxide layer except at those places where the die is secured to the supporting plate and the aluminum contacts are provided.

FIGS. 1, 2 and 3 illustrate the diffused zones in an ideal manner. With the manufacture of the transistor it should be considered that during the diffusion process through an opening in the oxide layer of the die the diffused zone extends away from the boundary of the opening below the oxide layer over a distance which is substantially equal to the penetration depth of the zone. A subsequent diffusion heating will involve a further diffusion of a substance already diffused into the die. Moreover, the lateral boundaries of the diffused zones will not precisely have the rectangular shape shown. The stepwise thickness variations shown in FIG. 1 will not be rectangular at 5 in FIG. 2; there is a certain degree of inclination. For the sake of clarity it should be noted that in this application the thinner part 7 of the base zone is considered to terminate at the top of such a slope.

In a practical embodiment the base zone of FIG. 1 was substantially rectangular and had dimensions of 120 x $50\mu$, while the emitter zone had dimensions of 30 x $40\mu$ and the minimum transverse dimension at the level of the centre of the strip-shaped emitter zone 3 of the part 1 was $40\mu$.

From the said surface concentrations of the thicker part 8 and of the thinner part 7 of the base zone 4 it will be seen that the transistor according to the invention described above has a thicker part 8 of higher resistivity than the thinner part 7. Consequently, this transistor has a comparatively large range for automatic gain control The said range may be further enlarged by increasing the difference in resistivities of the parts 7 and 8. A more advantageous embodiment with a greater difference in resistivities is obtained when the method described above is modified in the following manner.

On the same semiconductor die is first grown an oxide layer in the manner described above, but the die is not heated at 860° C. but at 1000° C., after which the opening is made in the resultant oxide layer for providing the thicker part 8.

The thicker part 8 is obtained as follows. The die is first heated in an oven at 1100° C. for 20 minutes, while boron nitride vapour is passed over by means of a flow of nitrogen. The vapour of boron nitride is obtained by heating boron nitride in the same oven at 1000° C. Then the die is heated for 30 minutes in an oxygen atmosphere saturated by water vapour of 98° C. at a temperature of 1000° C. The opening in the oxide layer is thus closed. Subsequently heating is carried out in dry nitrogen at a temperature of 1150° C. for 3 hours. The p-type thicker part 8 is then obtained to a thickness of about 5$\mu$, the surface concentration of boron atoms being about $3\times10^{18}$ atoms/ccm.

An opening is made in the grown oxide layer for providing the more highly doped part 1 of the collector zone. This part 1 is obtained in the manner described above. Also the thinner part 7 is obtained substantially in the manner described above. Only the following differences are involved. The die is heated for 30 minutes instead of 20 minutes at 1100° C. The boron nitride is heated at 1150° C. instead of 1000° C. The thickness of the resultant p-type thinner part 7 is 1.5$\mu$ instead of 1$\mu$.

The resultant transistor has improved properties and a larger range than the transistor in the preceding embodiment.

As an alternative, for example, the thinner part 7 or the thicker part 8 may be obtained by an epitaxial method. For example, through an opening in a mask (for example a photoresist) the part of the die where the thicker part 8 should be provided may be removed by etching. After the removal of the mask silicon with the desired concentration of impurities is grown in a conventional manner on the die until a grown silicon layer of a thickness is obtained, which is equal to the thickness of the desired part 8. After the die has been ground off to its initial thickness, it comprises the thicker part 8 in the form of an epitaxially grown part, at the place where part of the die has been removed by etching.

It will be obvious that the resistivity of the parts 7 and 8 if they are diffused zones, depends upon the temperatures at which and periods of time during which the diffusion steps are carried out. By a suitable choice of said magnitudes transistors may be obtained in which the thinner part 7 has a higher resistivity than the thicker part 8. Such transistors have greater sensitivity than the embodiments described above, but their range is smaller. Such transistors may also be obtained by epitaxial methods.

Such a transistor may be obtained for example by means of the method described with reference to the first embodiment, in which only the diffusion step for obtaining the thinner part 7 is modified in the following way. The die is heated for 40 minutes instead of 20 minutes at 1100° C., while the boron nitride is heated at 950° C. instead of 1000° C. The p-type zone 7 is then obtained with a thickness of about 1.5$\mu$ and a surface concentration of boron atoms of about $1\times10^{18}$ at./ccm.

Figure 4:
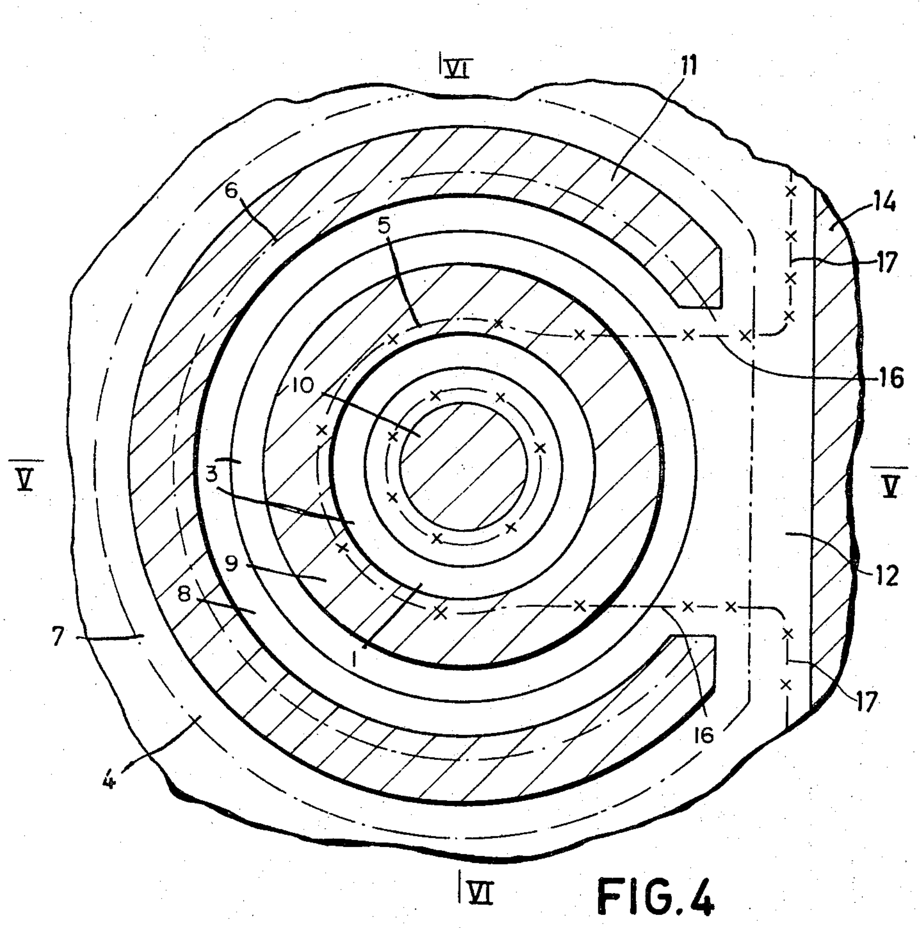
FIG. 4 is a plan view of a second embodiment of a transistor according to the invention.
Figure 5:
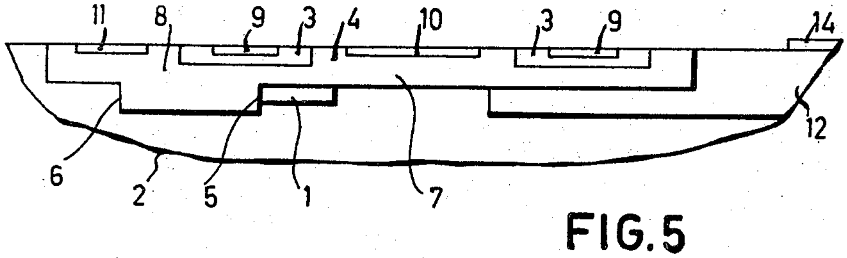
FIGS. 5 and 6 are cross sectional views taken on the lines V—V and VI—VI respectively in FIG. 4.
Figure 6:
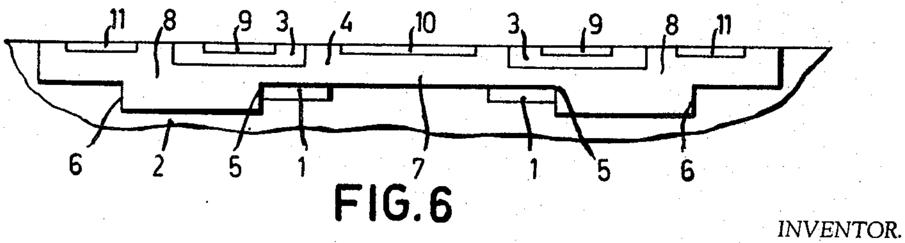

FIGS. 4, 5 and 6 show a second embodiment of a transistor according to the invention in which a concentrical configuration is employed. Corresponding parts are designated by the same reference numerals as in FIGS. 1, 2 and 3. The outermost, annular base contact 11 and the annular thicker part 8 of the base zone 4 have openings on the right-hand side at the area where the more highly doped part 1 of the collector zone extends to the right. The boundaries of the thicker part 8 of the base zone 4 and of the more highly doped part 1 at the said opening are indicated by the code lines 16 and 17. This concentrical transistor may be manufactured by a method similar to that described above for the manufacture of a transistor as shown in FIGS. 1, 2 and 3, the openings to be provided in the various oxide layers having, however, a different shape.

Figure 7:
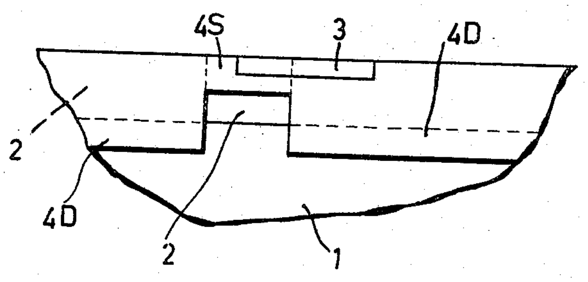
FIG. 7 shows partly a cross sectional view corresponding with that of FIG. 2 for a third embodiment of a transistor according to the invention and FIG. 8 shows a circuit diagram comprising a transistor according to the invention, which is connected in an automatic gain control arrangement.

FIG. 7 shows partly a cross sectional view corresponding with that of FIG. 2 for a transistor body in which the base zone has a slightly different shape, so that the manufacture is facilitated, while the base resistance of the transistor is reduced since the thicker part of the base zone has a larger extent.

The n-type silicon die 2 has a more highly doped layer 1 which is obtained by diffusion of phosphorus and which extends throughout the surface of the die.

In order to form the thicker part 4D of the base zone boron is diffused into the die, while the part 4S is not affected due to masking, and the shallow part 4S of the base zone is obtained by a second boron diffusion. The region of said second boron diffusion may overlap the region of the first diffusion, so that the manufacture is simplified. The boundary of the boron-overdoped parts of the layer 1 are indicated by broken lines.

Phosphorus is diffused into the die for obtaining an n-type emitter zone 3, while the previously diffused boron is overdoped. The further particularities of the method are otherwise identical to those of the method described with reference to FIGS. 1, 2 and 3.

It will be obvious that one or more zones may, as alternative, be obtained be epitaxial growth, instead of by diffusion.

Figure 8:
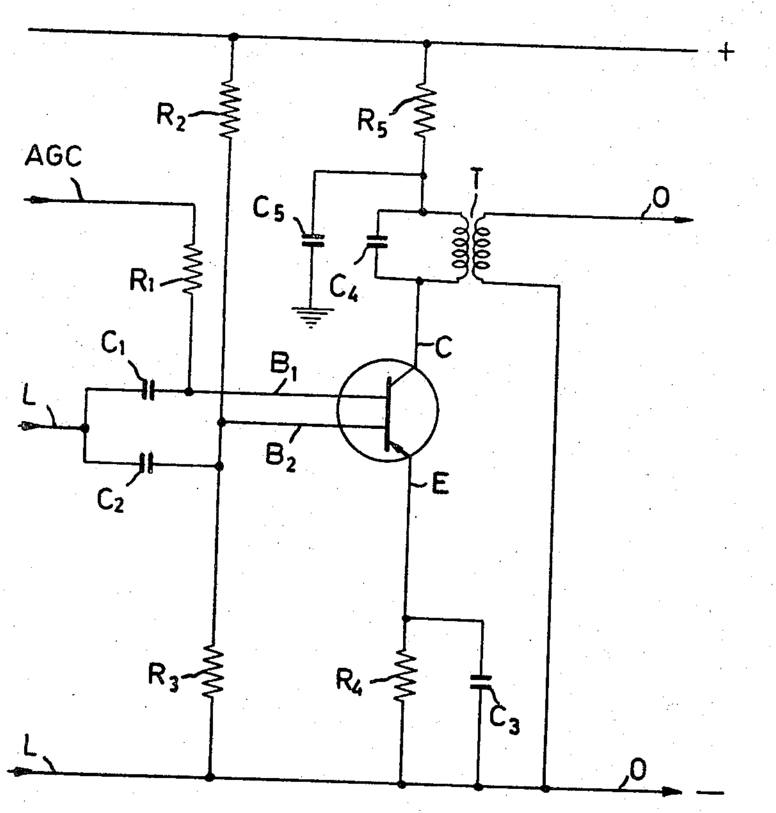

FIG. 8 shows a transistor according to the invention employed in a circuit arrangement for automatic gain control.

The base contacts B1 and B2 of the transistor T are connected via separate coupling capacitors C1 and C2 to a conductor I of the high-frequency signal input. A contact B1 is connected through a coupling resistor R1 to a bias input AGC of an automatic gain control circuit, whereas the other contact B2 is connected to a point of a potentiometer having resistors R2 and R3. The emitter contact E is connected to the negative supply terminal through a direct-current stabilizing resistor R4 and a capacitor C3, which are connected in parallel. The collector contact C is connected to a tuned circuit comprising the parallel combination of a capacitor C4 and the primary winding of an output transformer T. The other junction of the capacitor C4 and the primary winding is connected to the positive supply terminal through a decoupling resistor R5 and a parallel capacitor C5 is connected between the said further junction and the resistor R5. The output voltage is derived between the output terminals 0.

A few practical values, with an input signal of about 100 mc./s. are as follows.

R1 and R3: 10K ohms
R2: 50K ohms
R4 and R5: 500 ohms
C1, C2, C3 and C5: 1000 pfs.

The automatic gain control may also be connected in grounded base circuit connection (earth-connection for high frequencies), while the transistor according to the invention may also be used in other circuits than an automatic gain control circuit.

What is claimed is:

1. A bipolar transistor comprising a semiconductor body having emitter, base, and collector zones of alternate conductivity type forming at least two p-n junctions, said emitter, base, and collector zones being arranged in series with the base zone contiguous with and underneath the emitter zone and the collector zone underneath the base zone, the thickness of the base zone being defined as its smallest dimension between the junctions in the series direction of the zones, the portion of said base zone lying underneath the emitter zone being divided into at least two transverse regions of different thickness with each of said regions having a uniform thickness and being contiguous with the base zone, connections to the emitter and collector zones, a first base connection to the thicker region of the base portion, a second base connection to the thinner region of the base portion, means for biasing the emitter zone to inject carriers into the base zone, means for biasing the collector zone to collect carriers from the base zone, and means for applying a bias voltage between the first and second base connections to establish a transverse electrical field in the base portion and selectively control the injected carrier flow principally through the thicker or thinner base regions.

2. A transistor as set forth in claim 1 wherein the thicker region has a thickness at least twice that of the thinner region.

3. A transistor as set forth in claim 1 wherein the portion of said collector zone contiguous with the base zone is divided into at least two transverse regions of higher and lower conductivity each of which is contiguous with the base zone, the higher conductivity region being at least partly located beneath the emitter zone.

4. A transistor as set forth in claim 3 wherein the said higher conductivity region extends beneath the whole of the emitter zone.

5. A transistor as set forth in claim 3 wherein the higher conductivity collector region is located below the whole of the thinner base region.

6. A bipolar transistor comprising a semiconductor body having emitter, base, and collector zones of alternate conductivity type forming at least two p-n junctions, said emitter, base, and collector zones being arranged in series with the base zone contiguous with and underneath the emitter zone and the collector zone underneath the base zone, the thickness of the base zone being defined as its smallest dimension between the junctions in the series direction of the zones, said emitter zone being smaller than both the base and collector zones in the direction parallel to the junction, the portion of said base zone lying underneath the emitter zone being divided into at least two transverse regions of different thickness with each of said regions having a uniform thickness and being contiguous with the base zone, said thicker and thinner regions of the base portion having different resistivities, connections to the emitter and collector zones, a first base connection to the thicker region of the base portion, a second base connection to the thinner region of the base portion, means for biasing the emitter zone to inject carriers into the base zone, means for biasing the collector zone to collect carriers from the base zone, and means for applying a bias voltage between the first and second base connections to establish a transverse electrical field in the base portion and selectively control the injected carrier flow principally through the thicker or thinner base regions.

7. A transistor as set forth in claim 6 wherein the said thinner region has a higher resistivity than the thicker region.

8. A transistor as set forth in claim 6 wherein the lateral extent of the base zone perpendicular to its thickness is at least three times that of the emitter zone.

References Cited

UNITED STATES PATENTS

| | | | |
|---|---|---|---|
| 2,869,055 | 1/1959 | Noyce | 317—235 |
| 2,870,052 | 1/1959 | Rittmann | 148—33 |
| 2,910,653 | 10/1959 | Pritchard | 331—108 |
| 3,246,172 | 4/1966 | Sanford | 307—88.5 |
| 3,305,913 | 2/1967 | Loro | 29—25.3 |

JOHN W. HUCKERT, *Primary Examiner.*

R. F. SANDER, *Assistant Examiner.*